US012400822B2

(12) United States Patent
Kim

(10) Patent No.: US 12,400,822 B2
(45) Date of Patent: Aug. 26, 2025

(54) PARTICLE TRANSFER BLOCKING DEVICE AND LITHOGRAPHY DEVICE USING ELECTRON LAYER IN VACUUM SYSTEM

(71) Applicant: DERKWOO SEMITECH CO., LTD., Seoul (KR)

(72) Inventor: Ki Bum Kim, Seoul (KR)

(73) Assignee: DERKWOO SEMITECH CO., LTD., Seoul (KR)

( * ) Notice: Subject to any disclaimer, the term of this patent is extended or adjusted under 35 U.S.C. 154(b) by 0 days.

(21) Appl. No.: 18/710,419

(22) PCT Filed: Nov. 15, 2022

(86) PCT No.: PCT/KR2022/017921
§ 371 (c)(1),
(2) Date: May 15, 2024

(87) PCT Pub. No.: WO2023/090796
PCT Pub. Date: May 25, 2023

(65) Prior Publication Data
US 2024/0429015 A1    Dec. 26, 2024

(30) Foreign Application Priority Data
Nov. 16, 2021    (KR) .......................... 10-2021-0158083

(51) Int. Cl.
*G03F 7/20*    (2006.01)
*G03F 7/00*    (2006.01)
*H01J 3/40*    (2006.01)

(52) U.S. Cl.
CPC ............ *H01J 3/40* (2013.01); *G03F 7/70866* (2013.01); *G03F 7/70916* (2013.01)

(58) Field of Classification Search
CPC .... H01J 3/40; G03F 7/70866; G03F 7/70916; H05G 2/0025
See application file for complete search history.

(56) References Cited

U.S. PATENT DOCUMENTS

| 6,781,673 B2 | 8/2004 | Moors et al. |
| 2005/0051421 A1 | 3/2005 | Quesnel et al. |

(Continued)

FOREIGN PATENT DOCUMENTS

| JP | 2002-030443 A | 1/2002 |
| JP | 2004-332115 A | 11/2004 |

(Continued)

OTHER PUBLICATIONS

KR Office Action dated May 9, 2022 as received in Application No. 10-2021-0158083.

(Continued)

*Primary Examiner* — Mesfin T Asfaw
(74) *Attorney, Agent, or Firm* — Maschoff Brennan

(57) ABSTRACT

The present invention relates to a device designed to prevent fine particles produced in a vacuum system from being adsorbed to a semiconductor substrate and a sample or prevent the fine particles from being adsorbed to a mask in a lithography device using the vacuum system and, more specifically, to an extreme ultraviolet lithography device not using a membrane type pellicle. An embodiment of a particle transfer blocking device according to the present invention comprises: a vacuum chamber in which an accommodation part is formed; and a barrier module which is provided in the vacuum chamber and divides the accommodation part of the chamber into a first region and a second region, wherein the barrier module is not a physical barrier but an electrical potential barrier serving to prevent predetermined particles located in the first region from transferring to the second region.

17 Claims, 1 Drawing Sheet

(56) References Cited

U.S. PATENT DOCUMENTS

2005/0242300 A1* 11/2005 Silverman ........... G03F 7/70916
          250/492.2
2006/0138361 A1   6/2006 Van Herpen
2009/0186282 A1   7/2009 Wu et al.
2014/0253887 A1   9/2014 Wu et al.

FOREIGN PATENT DOCUMENTS

| KR | 10-2002-0016564 A | 3/2002 |
| KR | 10-2007-0007848 A | 1/2007 |
| KR | 10-2018-0067175 A | 6/2018 |

OTHER PUBLICATIONS

KR Office Action dated Jul. 20, 2022 as received in Application No. 10-2021-0158083.
KR Decision to Grant Dated Oct. 28, 2022 as received in Application No. 10-2021-0158083.
Extended European Search Report dated Jun. 3, 2025 as received in Application No. 22896002.7.

* cited by examiner

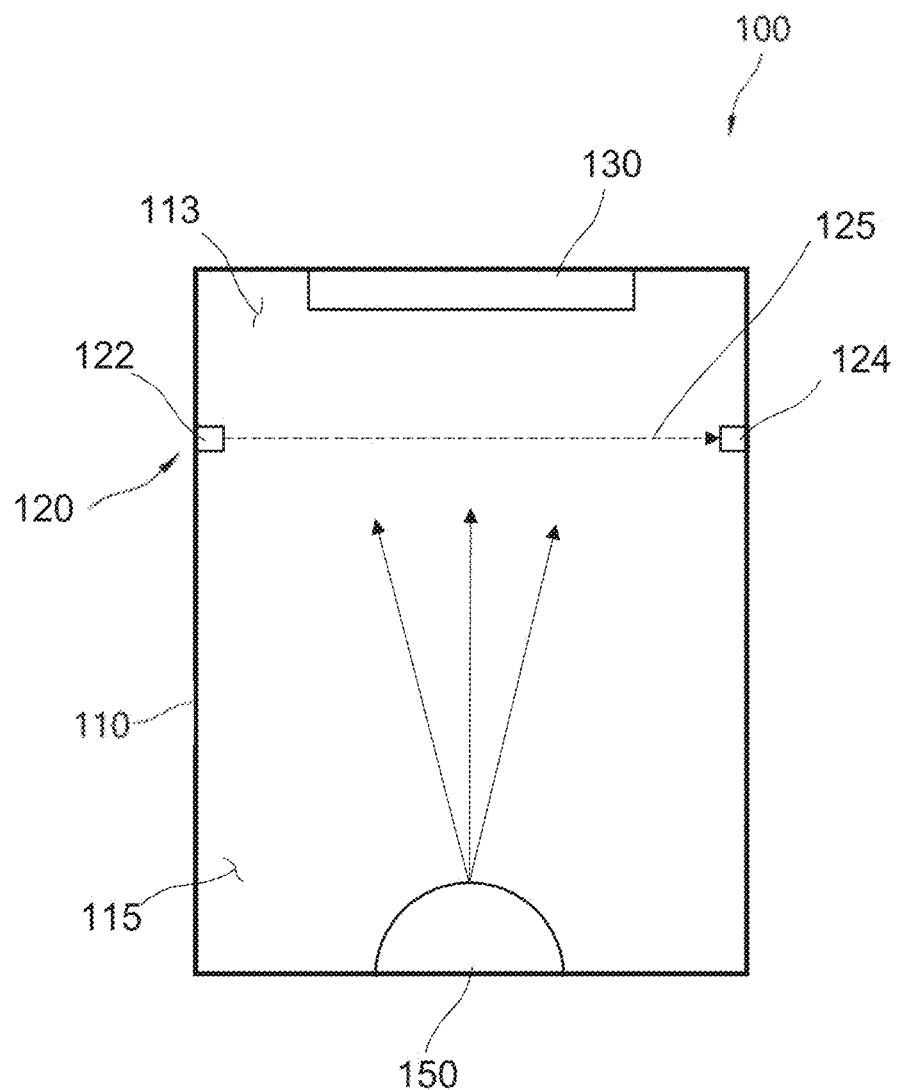

PARTICLE TRANSFER BLOCKING DEVICE AND LITHOGRAPHY DEVICE USING ELECTRON LAYER IN VACUUM SYSTEM

CROSS REFERENCE OF RELATED APPLICATION

This present application claims the benefit of the earlier filing date of Korean non-provisional patent application No. 10-2021-0158083, filed on Nov. 16, 2021, the entire contents of which being incorporated herein by reference.

FIELD OF THE DISCLOSURE

The present invention relates to a device designed to prevent fine particles produced in a vacuum system from being adsorbed to a semiconductor substrate and a sample or prevent the fine particles from being adsorbed to a mask in a lithography device using the vacuum system and, more specifically, to an extreme ultraviolet lithography device not using a membrane type pellicle.

BACKGROUND OF THE DISCLOSURE

During manufacturing processes of semiconductor devices, a process of depositing a thin film on a semiconductor wafer by using various methods such as physical deposition or chemical deposition or a process of etching the deposited thin film may be accompanied. The depositing process or the etching process is typically performed in a vacuum chamber, but if dusts which have flowed from outside during the depositing process or the etching process or fine particles produced in the vacuum chamber may be adsorbed on the semiconductor wafer, the manufactured semiconductor devices may be unable to operate, thereby leading to a degradation of yields of the semiconductor manufacturing processes.

Besides, a patterning process is necessary to form an integrated circuit using the deposited thin film. Herein, a method called photolithography may be used as the patterning process. During the patterning process using the photolithography, a photomask may be used as a template for the patterning and a pattern on the photomask may be imprinted onto the wafer. However, if the photomask has undesirably adsorbed the dusts or the fine particles, the imprinted pattern may be damaged because light is absorbed therein or reflected thereby due to the dusts or the fine particles thereon, thereby decreasing a performance or a yield of a semiconductor device.

Therefore, overall procedures of the semiconductor integrated processes are typically conducted in a clean room, but, because of the dusts in the clean room or the fine particles produced during the semiconductor integrated processes, a membrane type pellicle is attached to the photomask with a specific distance therefrom in order to prevent the dusts or the fine particles from being adsorbed. In this case, the dusts or the fine particles are not directly adsorbed on a surface of the photomask but on the pellicle membrane. Since a focal point is still matched with the pattern of the photomask even if the dusts are adsorbed on the pellicle, the dusts on the pellicle do not correspond to the focal point and thus are not imprinted to the pattern.

Since the pellicle should have high transmittance for exposure light, the pellicle is configured with a very thin membrane. Especially, as developments of the micropatterning process are in progress, since a resolution power of the lithography is proportional to a wavelength used for the lithography, an EUV (Extreme Ultra-Violet) lithography device with a wavelength of 13.5 nm is developed from a conventional lithography device using an ArF wavelength. To keep achieving scaling down the size of the semiconductor pattern, it is expected that the lithography device will use a shorter wavelength gradually. But the problem is as follows. Because of a very high absorbance of the EUV light at the time of penetrating air layer or material, the lithography device should be operated in a vacuum device and the membrane structure with a very thin film of tens of nanometers or less should be used in order to guarantee the transmittance higher than a certain value. The thin membrane type pellicle as such has a problem in that the thin film may be damaged or droop because of impacts from outside or stresses at the thin film itself. Further, the pellicle should not be corroded by hydrogen radicals generated during the processes of the lithography and be thermostable to cope with temperature increased by absorbing EUV wavelength. Especially, since the damage or the drooping of the thin film can distort images during the process of imprinting the pattern, a mechanical strength of the thin film of the pellicle should be maintained in order to sustain a complete flat state thereof without the drooping or the damage.

For this matter, a method of assigning an adequate tensile stress to the thin film itself or a method of additionally forming supporting layer to prevent the thin film of the pellicle from being distorted may be adopted, but the method may cause not only a complexity in a process of manufacturing the pellicle but also a problem of decrease in the transmittance of the thin film for the pellicle due to the addition of the supporting layer, thereby making the development of the pellicle for the EUV lithography difficult. Therefore, it is necessary to develop a new type lithography device which prevents the fine particles or the dusts from being adsorbed on the mask even without using the membrane type pellicle.

SUMMARY OF THE DISCLOSURE

It is an object of the present disclosure to solve the conventional problems and to provide a lithography device that (i) generates electron beams which is spaced apart by a specific distance from the upper part of a semiconductor substrate such that electrons of an electron layer provide charge to particles or dusts when the particles or the dusts approach the semiconductor substrate and thus (ii) prevents the charged dusts or the charged particles from approaching the substrate with the help of an electrical potential barrier formed by the electron layer. Also, it is another object of the present disclosure to provide the lithography device without using a membrane type pellicle by installing the electrical potential barrier configured with the electron layer as such in between a light source for the lithography and the photomask.

To solve the technical problems, an embodiment of particle transfer blocking device according to the present disclosure comprises: a vacuum chamber in which an accommodation part is formed; and a barrier module which is provided in the vacuum chamber and divides the accommodation part of the chamber into a first region and a second region; wherein the barrier module is not a physical barrier but an electrical potential barrier serving to prevent particles located in the first region from transferring to the second region.

In some embodiments of the particle transfer blocking device according to the present disclosure, the barrier module is configured to include one or more electron beams generated by a one-dimensional charged particle generator.

In some embodiments of the particle transfer blocking device according to the present disclosure, the barrier module is configured to include a plurality of electron beams each of which is spaced apart by a predetermined distance.

In some embodiments of the particle transfer blocking device according to the present disclosure, the barrier module includes an electron beam generator installed on one side inside the chamber; and an electron beam receptor installed on another side inside the chamber, wherein the electron beam receptor receives one or more electron beams generated by the electron beam generator.

In some embodiments of the particle transfer blocking device according to the present disclosure, the particles are at least one of dusts and fine particles which are produced during processes.

To solve the technical problems, an embodiment of a lithography device according to the present disclosure comprises: a vacuum chamber in which an accommodation part is formed; and a barrier module which is provided in the vacuum chamber and divides the accommodation part of the chamber into a first region where a light source for lithography is located and a second region where a substrate is located; wherein the barrier module is not a physical barrier but an electrical potential barrier serving to prevent particles located in the first region from transferring to the second region.

In some embodiments of the lithography device according to the present disclosure, the barrier module is configured to include one or more electron beams generated by a one-dimensional charged particle generator.

In some embodiments of the lithography device according to the present disclosure, the barrier module is configured to include a plurality of electron beams each of which is spaced apart by a predetermined distance.

In some embodiments of the lithography device according to the present disclosure, the barrier module includes: an electron beam generator installed on one side inside the chamber; and an electron beam receptor installed on another side inside the chamber, wherein the electron beam receptor receives one or more electron beams generated by the electron beam generator.

In some embodiments of the lithography device according to the present disclosure, the particles are at least one of dusts and fine particles which are produced during processes.

In some embodiments of the lithography device according to the present disclosure, the particles are the dusts and Sn particles.

In some embodiments of the lithography device according to the present disclosure, a mask is formed at the substrate.

In some embodiments of the lithography device according to the present disclosure, the light source is an EUV (Extreme Ultraviolet) light source.

BRIEF DESCRIPTION OF THE DRAWING

FIG. 1 is a drawing schematically illustrating an example embodiment of a lithography device.

DETAILED DESCRIPTION OF THE PREFERRED EMBODIMENTS

Hereinafter, embodiments of the present disclosure will be described in detail with reference to the accompanying drawings. The embodiments of the present disclosure are to provide the persons having ordinary skill in the art with a more complete description of the present disclosure, and the following examples may be modified in various other forms, however, the scope of the present disclosure is not limited to the embodiments.

Rather, the embodiments are provided to render the present disclosure more faithful and complete and to fully introduce the spirit of the present disclosure to the persons having ordinary skill in the art.

In the drawings, for example, depending on manufacturing techniques and/or tolerances, variations of the illustrated shape can be expected. Accordingly, the embodiments of the present disclosure should not be construed as being limited to the specific shape of the region disclosed in the present specification but should include, for example, changes in a shape caused when manufacturing the same. The same reference numerals are assigned to similar parts throughout the specification. Furthermore, various elements and areas in the drawings are schematically drawn. Accordingly, the present disclosure is not limited by the relative size or spacing drawn in the accompanying drawings.

The present disclosure relates to a particle transfer blocking device which uses a barrier module configured with an electrical potential barrier (not a physical potential barrier) to prevent various particles such as fine particles and dusts located in one side of the barrier module or fine particles produced during processes from drifting toward another side of the barrier module, and especially, to prevent the dusts or the fine particles produced during the processes from drifting not by physical collisions with the barrier module but by the electrical potential barrier. Herein, the barrier module is the electrical potential barrier with various shapes capable of blocking a transfer of the particles by electrically dividing a certain area from another area, and, for example, the barrier module includes a plurality of electron beams spaced apart by a predetermined distance. For this matter, the barrier module may include an electron beam generator and an electron beam receptor which receives the electron beams generated by the electron beam generator.

This particle transfer blocking device can be applied to various devices like a vacuum processing device which performs depositing or etching processes. Also, this particle transfer blocking device can be applied to a lithography device to prevent the dusts or the Sn particles located near the light source for lithography from drifting to a substrate, thereby enabling an EUV lithography device not to use a pellicle. The lithography device according to a present embodiment is explained with a drawing as below.

FIG. 1 is a drawing schematically illustrating a lithography device according to one example embodiment of the present disclosure.

By referring to FIG. 1, the lithography device 100 according to the present invention includes a chamber 110 and a barrier module 120.

An accommodation part inside the chamber 110 is comprised of two parts 113 and 115 and the inside of the chamber 110 may be maintained as a vacuum condition with a vacuum pump (not shown). The accommodation part of the chamber 110 is divided into a first region 115 and a second region 113.

Inside the chamber 110, a light source 150 for lithography is located in the first region 115 and the substrate 130 such as a semiconductor wafer is located in the second region 113. The light source 150 for lithography may be an EUV light source, but it is not limited thereto. As another example, a different light source whose wavelength is shorter than the EUV light source can be used. A photomask for lithography is formed on a surface of the substrate 130. Further, a pellicle may be formed on the photomask if necessary.

The barrier module 120 is prepared for preventing the particles in the first region 115 such as the dusts or Sn particles from drifting to the second region 113. Herein the barrier module 120 is not a physical barrier but an electrical potential barrier. For example, as illustrated in FIG. 1, electron beams 125 may be used as the barrier module 120. In this case, the electron beams 125 may be generated by a one-dimensional charged particle generator. Herein, the plurality of electron beams 125 may be spaced apart with its adjacent electron beam(s) by a predetermined distance, to thereby divide the accommodation part of the chamber 110 into the first region 115 and the second region 113. The electron beams 125 generated at an electron beam generator 122 may be incident to the inside of the chamber 110 and received at an electron beam receptor 124. The number, the predetermined distance, an arrangement, and an energy of the electron beams 125 can be determined with optimized values. Also, FIG. 1 illustrates the plurality of electron beams 125 are arranged on a same plane, but it is not limited thereto. For example, each of the electron beams can be located in each different plane or in two or more layers.

If the first region 115 and the second region 113 are distinguished from each other due to the plurality of electron beams 125, the particles such as the dusts or the Sn Particles located in the first region 115 are prevented from drifting to the second region 113. If the particles such as the dusts or the Sn particles are negatively (−) charged, the particles cannot penetrate the electron beams 125 because of the electrical potential barrier of the barrier module 120 comprised of the plurality of the electron beams 125, thereby allowing the particles not to drift toward the second region 113. Further, even if the particles such as the dusts or the Sn particles are positively (+) charged or not charged, the particles become negatively charged when they are approaching the barrier module 120 comprised of the plurality of electron beams 125, thereby preventing the particles from drifting to the second region 113 through the electron beams 125 of the barrier module 120.

That is, if the barrier module 120 is configured as such according to the present embodiment, the particles such as the dusts or the Sn particles on the light source 150 for lithography are not allowed to be transferred to the substrate 130 not by the physical barrier but by the electrical potential barrier, thereby preventing the dusts from being adsorbed to the substrate 130. As a result, the pellicle is not necessary to the lithography device 100 according to the present invention and complicated processes for manufacturing the pellicle can be omitted. Also, since the barrier module 120 can be used almost permanently unlike the pellicle, the cost for lithography can be reduced.

Finally, as explained above, it is obvious that the particle transfer blocking device using the electrical potential barrier can be used not only for the lithography device but also for other devices such as devices performing depositing and etching processes which require the vacuum processing chambers with various types in which particles on the substrates can be problematic. Also, the particles of the present invention include the dusts, the fine particles with various shapes, and various particles generated during the processes.

In accordance with one example embodiment of the present invention, by installing the electrical potential barrier configured with the electron beams in between the substrate and the light source for lithography, the dusts or the particles located near the light source for lithography are prevented from approaching a surface of the substrate, thereby achieving the lithography device without the pellicle.

Although the embodiments of the present disclosure have been illustrated and described above, the present disclosure is not limited to the specific embodiments described above and is not departing from the gist of the present disclosure claimed in the claims. A person having ordinary skill in the art may implement various modifications, and such modifications are included within the scope of the appended claims.

What is claimed is:

1. A particle transfer blocking device comprising:
   a vacuum chamber in which an accommodation part is formed; and
   a barrier module which is provided in the vacuum chamber and configured with one or more electron beams which divide the accommodation part of the chamber into a first region and a second region;
   wherein the barrier module is not a physical barrier but an electrical potential barrier for (i) blocking transfer of first particles with originally negative charge and (ii) negatively charging particles with originally positive charge or without charge to generate negatively-charged second particles and then blocking transfer of the second particles, such that the first particles and the second particles located in the first region are prevented from transferring to the second region due to electro-magnetic repulsion, and
   wherein, the barrier module includes an electron beam generator installed on one side inside the chamber and an electron beam receptor installed on an opposite side inside the chamber, wherein the electron beam receptor receives one or more electron beams generated by the electron beam generator.

2. The particle transfer blocking device of claim 1, wherein the barrier module is configured to include the electron beams generated by a one-dimensional charged particle generator.

3. The particle transfer blocking device of claim 2, wherein the particles are at least one of dusts and fine particles which are produced during processes.

4. The particle transfer blocking device of claim 1, wherein the barrier module is configured to include the electron beams of which a cardinal number is plural and each of the electron beams is spaced apart by a predetermined distance.

5. The particle transfer blocking device of claim 4, wherein the particles are at least one of dusts and fine particles which are produced during processes.

6. The particle transfer blocking device of claim 1, wherein the particles are at least one of dusts and fine particles which are produced during processes.

7. The particle transfer blocking device of claim 1, wherein the particles are at least one of dusts and fine particles which are produced during processes.

8. A lithography device comprising:
   a vacuum chamber in which an accommodation part is formed; and
   a barrier module which is provided in the vacuum chamber and divides configured with one or more electron beams which divide the accommodation part of the chamber into a first region where a light source for lithography is located and a second region where a substrate is located;

wherein the barrier module is not a physical barrier but an electrical potential barrier for (i) blocking transfer of first particles with originally negative charge and (ii) negatively charging particles with originally positive charge or without charge to generate negatively-charged second particles and then blocking transfer of the second particles, such that the first particles and the second particles located in the first region are prevented from transferring to the second region due to electromagnetic repulsion, and wherein, the barrier module includes an electron beam generator installed on one side inside the chamber and an electron beam receptor installed on an opposite side inside the chamber, wherein the electron beam receptor receives one or more electron beams generated by the electron beam generator.

9. The lithography device of claim 8, wherein the barrier module is configured to include the electron beams generated by a one-dimensional charged particle generator.

10. The lithography device of claim 9, wherein the particles are at least one of dusts and fine particles which are produced during processes.

11. The lithography device of claim 9, wherein a mask is formed at the substrate.

12. The lithography device of claim 8, wherein the barrier module is configured to include the electron beams of which a cardinal number is plural and each of the electron beams is spaced apart by a predetermined distance.

13. The lithography device of claim 12, wherein the particles are at least one of dusts and fine particles which are produced during processes.

14. The lithography device of claim 8, wherein the particles are at least one of dusts and fine particles which are produced during processes.

15. The lithography device of claim 14, wherein the particles are the dusts and Sn particles.

16. The lithography device of claim 8, wherein a mask is formed at the substrate.

17. The lithography device of claim 8, wherein the light source is an EUV (Extreme Ultraviolet) light source.

* * * * *